(12) United States Patent
Ochiai et al.

(10) Patent No.: US 11,545,911 B2
(45) Date of Patent: Jan. 3, 2023

(54) INVERTER POWER SUPPLY

(71) Applicant: Dengensha Toa Co., Ltd., Kawasaki (JP)

(72) Inventors: Yoshihiko Ochiai, Kanagawa (JP); Shinichi Sato, Kanagawa (JP); Motoaki Fuchiwaki, Kanagawa (JP)

(73) Assignee: Dengensha Toa Co., Ltd., Kawasaki (JP)

( * ) Notice: Subject to any disclaimer, the term of this patent is extended or adjusted under 35 U.S.C. 154(b) by 332 days.

(21) Appl. No.: 16/959,009

(22) PCT Filed: Aug. 8, 2019

(86) PCT No.: PCT/JP2019/031519
§ 371 (c)(1),
(2) Date: Jun. 29, 2020

(87) PCT Pub. No.: WO2020/095501
PCT Pub. Date: May 14, 2020

(65) Prior Publication Data
US 2020/0336082 A1 Oct. 22, 2020

(30) Foreign Application Priority Data
Nov. 7, 2018 (JP) .............................. JP2018-210024

(51) Int. Cl.
*B23K 11/11* (2006.01)
*B23K 11/24* (2006.01)
*H02M 7/48* (2007.01)

(52) U.S. Cl.
CPC ............... *H02M 7/48* (2013.01); *B23K 11/11* (2013.01); *B23K 11/24* (2013.01)

(58) Field of Classification Search
CPC ..... G01R 31/3277; G01R 31/42; Y02T 10/62; Y02T 10/64; Y02T 10/72; H02M 7/48;
(Continued)

(56) References Cited

U.S. PATENT DOCUMENTS 3,965,329 A * 6/1976 Petrides ................. B23K 9/095
219/124.1
4,434,347 A * 2/1984 Kurtz .................. H01L 21/4825
219/56.22
(Continued)

FOREIGN PATENT DOCUMENTS

JP      3008433 U      3/1995
JP      H10191656 A    7/1998
(Continued)

OTHER PUBLICATIONS

English translation of JP 2007220944 (Year: 2007).*
(Continued)

*Primary Examiner* — Chris Q Liu
(74) *Attorney, Agent, or Firm* — Young Basile Hanlon & MacFarlane, P.C.

(57) ABSTRACT

Provided is an inverter power supply including a measurement function of measuring deterioration of a rectifier element such as a diode.

The inverter power supply includes a step-down stabilization unit that applies a reverse voltage increasing gradually to diodes, an isolation amplifier that detects a current value of a current flowing to the diodes when the reverse voltage is applied, and an inverter control unit that decides that the diodes have deteriorated when the detected current value is larger than a determination current value for determining deterioration of the diodes, and decides that the diodes have not deteriorated when the detected current value is smaller than the determination current value.

6 Claims, 7 Drawing Sheets

(58) Field of Classification Search
CPC ....... B23K 11/11; B23K 11/24; B23K 9/0956; B23K 9/067; B23K 9/073; B23K 9/095; B23K 9/1006; B23K 9/1043; B23K 9/1056; B23K 10/006; B23K 11/257; B23K 37/0294; B23K 9/0286; B23K 9/09; B23K 9/091; B23K 9/1062; B23K 9/1093; B23K 9/127; B23K 9/1333; B23K 9/24; B23K 9/30
USPC .......... 219/660, 121.34, 130.1, 137 PS, 240, 219/250, 268, 477, 482, 485, 130.21, 219/130.01, 130.51, 110, 124.02, 124.1, 219/124.34, 125.12, 130.31, 130.32, 219/130.33, 132, 56.21, 56.22, 75, 85.18; 363/142, 71

See application file for complete search history.

(56) References Cited

U.S. PATENT DOCUMENTS 5,061,841 A * 10/1991 Richardson .......... B23K 9/0956 219/130.01

2003/0132211 A1 * 7/2003 Aigner ................ H02M 7/5236 219/130.21
2016/0011266 A1 1/2016 Osanai
2016/0098051 A1 * 4/2016 Enyedy .................. G05F 1/625 307/52

FOREIGN PATENT DOCUMENTS

| JP | H10-232249 A | 9/1998 |
| JP | 2000-42751 A | 2/2000 |
| JP | 2004335266 A | 11/2004 |
| JP | 2007-220944 A | 8/2007 |
| JP | 2013-158825 A | 8/2013 |
| JP | 2016-21652 A | 2/2016 |
| JP | 2017-087280 A | 5/2017 |

OTHER PUBLICATIONS

Office Action of corresponding China application CN 201980006348.2; dated Apr. 27, 2021; 16 pages with English translation.

Extended European Search Report of corresponding application EP 19882435.1; dated Oct. 14, 2021; 7 pages.

Office Action of corresponding Canadian application CA 3,083,396; dated Jun. 21, 2021; 3 pages.

* cited by examiner

INVERTER POWER SUPPLY

CROSS-REFERENCE TO RELATED APPLICATIONS

The present application is a 371 application of International Patent Application Serial No. PCT/JP2019/031519, filed Aug. 8, 2019, which claims priority to and the benefit of Japanese Patent Application No. 2018-210024 filed Nov. 7, 2018, the entire contents of which are incorporated herein by reference.

TECHNICAL FIELD

The present invention relates to an inverter power supply having a measurement function of measuring deterioration of a rectifier element such as a diode.

BACKGROUND

In recent years, high tensile steel plates having higher tensile strength than conventional steel plates have been used for automobile bodies in order to secure strength and reduce weight. When high tensile steel plates are spot-welded, it is necessary to energize a larger welding current for a longer time than when the conventional steel plates are spot-welded. Consequently, an inverter-type resistance welder as disclosed in JP 2017-087280 A, JP 2000-42751 A and JP 3008433 U that can set a wide range of welding conditions and perform high-quality welding has been used for spot-welding the high tensile steel plates. The inverter type resistance welder includes an inverter power supply and an inverter transformer, and the inverter transformer has a diode stack (a unit combining two or more diodes) that rectifies a welding current. The diode stack provided in the inverter transformer easily deteriorates because a large welding current is energized to the diode stack during spot-welding.

SUMMARY

However, the deterioration of the diode stack progresses differently depending on individual performance, use environment, frequency of use, welding conditions, and the like. In a resistance welder disposed in a production line of a factory, when the diode stack fails due to unexpected deterioration, the production line is forced to stop for a replacement of the diode stack, which takes a long time. It is therefore important to be able to periodically check a deterioration degree of the diode stack in order to prevent the production line from stopping.

In recent years, since the resistance welder is provided as a welding robot, an operator must enter a movable range of the welding robot in order to periodically check the deterioration degree of the diode stack. Therefore, the operator is at considerable risk during the checking operation.

The present invention has been made to solve these problems, and an object of the present invention is to provide an inverter power supply having a measurement function of measuring deterioration of a rectifier element such as a diode.

An inverter power supply according to the present invention for achieving the above object includes a power source that applies a reverse voltage increasing gradually to a rectifier element, a current detection unit that detects a current value of a current flowing through the rectifier element when the reverse voltage is applied, and a control unit that decides that the rectifier element has deteriorated when the detected current value is larger than a determination current value for determining the deterioration of the rectifier element, and decides that the rectifier element has not deteriorated when the detected current value is smaller than the determination current value for determining the deterioration of the rectifier element.

According to the inverter power supply of the present invention, since the deterioration of the rectifier element is decided by the current value of the current that flows when the reverse voltage is applied to the rectifier element, the deterioration degree of the rectifier element can be measured easily. From the periodic measurement, the deterioration degree of the rectifier element can be known, and the rectifier element can be preventively maintained and maintained as scheduled. The inverter power supply itself has a measurement function of measuring the deterioration of the rectifier element. Thus, if a circuit for applying a voltage from the power source to the rectifier element can be automatically formed, the deterioration can be measured automatically and periodically while the production line is operating.

DETAILED DESCRIPTION

Hereinafter, an embodiment of an inverter power supply according to the present invention will be described in detail with reference to the drawings.

<Configuration of Inverter Power Supply>

Figure 1:
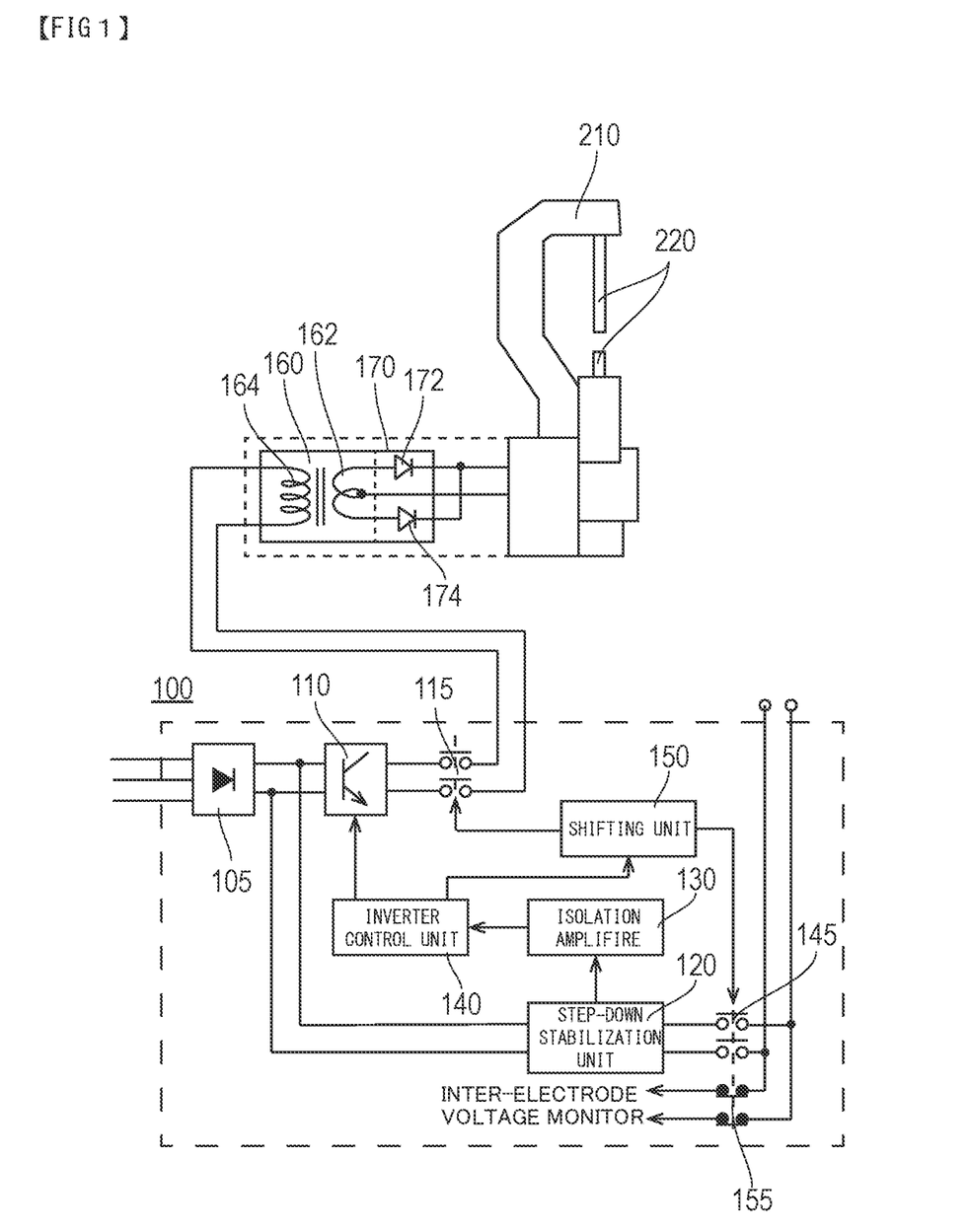
FIG. 1 is a schematic configuration diagram of a welding robot including an inverter power supply of an embodiment.

FIG. 1 is a schematic configuration diagram of a welding robot including an inverter power supply of the embodiment. The inverter power supply 100 has a function of measuring a deterioration degree of diodes 172 and 174 of a diode stack 170 of an inverter transformer 160 included in the welding robot (welding gun 210 in the drawing) functioning as a resistance welder.

The inverter power supply 100 includes a rectification unit 105, a switching unit 110, and an A contact relay 115. The A contact relay 115 is connected to a primary winding 164 of the inverter transformer 160. Further, the inverter power supply 100 includes a step-down stabilization unit 120, an isolation amplifier 130, an inverter control unit 140 functioning as a controller, an A contact relay 145, a shifting unit 150, and a B contact relay 155 working with the A contact relay 145. The B contact relay 155 is a relay for an inter-electrode voltage monitor used for measuring a voltage between electrodes 220. Meanwhile, the inverter transformer 160 has the diode stack 170. The diode stack 170 includes the two diodes 172 and 174. The diodes 172 and 174 are connected to a secondary winding 162 of the inverter transformer 160. The inverter transformer 160 is incorporated in the welding gun 210 of the welding robot, and supplies a welding current between the electrodes 220 of the welding gun 210. The inverter transformer 160 generates an AC welding current, and converts the AC welding current into a DC welding current by the diodes 172 and 174 of the diode stack 170. The DC welding current is supplied to a steel plate (not shown) pressurized between the electrodes 220, and the steel plate is spot-welded by the electrodes 220.

The rectification unit 105 is connected to a three-phase commercial power source, converts, for example, three-phase 50 Hz AC into DC, and supplies power to all components of the inverter power supply 100. The switching unit 110 is switched by a switching signal output from the inverter control unit 140, and outputs a welding current corresponding to welding conditions. The shifting unit 150 shifts between a normal mode in which the welding current is supplied to the welding gun 210 and a measurement mode in which the deterioration of the diodes 172 and 174 of the diode stack 170 is determined. The normal mode and the measurement mode are shifted by the inverter control unit 140. The shifting unit 150 also turns on and off the A contact relay 115. When the shifting unit 150 has been shifted to the normal mode, the inverter control unit 140 switches the switching unit 110 and the shifting unit 150 turns on the A contact relay 115. The switching unit 110 and the primary winding 164 of the inverter transformer 160 are thus connected, and the welding current is supplied to the primary winding 164. On the other hand, when the shifting unit 150 has been shifted to the measurement mode, the shifting unit 150 turns off the A contact relay 115 to disconnect the switching unit 110 from the primary winding 164 of the inverter transformer 160. Further, the shifting unit 150 turns on the A contact relay 145, turns off the B contact relay working with the A contact relay 145, supplies the DC of the rectification unit 105 to the step-down stabilization unit 120, and causes the isolation amplifier 130 to function. That is, when the shifting unit 150 has been shifted to the normal mode, the step-down stabilization unit 120 and the isolation amplifier 130 functioning as a current detection unit stop functioning. When the shifting unit 150 has been shifted to the measurement mode, the step-down stabilization unit 120 and the isolation amplifier 130 start functioning.

The step-down stabilization unit 120 is a power source that applies a reverse voltage Va that is a constant voltage or a gradually increasing voltage to the diodes 172 and 174 that are rectifier elements, using a voltage supplied from the rectification unit 105. In this case, although not shown, the step-down stabilization unit 120 and the electrodes 220 of the welding gun 210 need to be electrically connected. The step-down stabilization unit 120 is programmed such that the reverse voltage applied to the diodes 172 and 174 is a constant voltage or is increased stepwise, and that the reverse voltage is increased stepwise from a voltage at a current step to a voltage at a next step over a fixed period of time when the reverse voltage is increased to the next step.

A maximum voltage of the reverse voltage applied to the diodes 172 and 174 by the step-down stabilization unit 120 is from 20% to 60% of a reverse withstand voltage of the diodes 172 and 174 in order to prevent the diodes 172 and 174 from being damaged when the reverse voltage is applied to the diodes 172 and 174 that have been deteriorating. For example, assuming that the reverse withstand voltage of the diodes 172 and 174 is 600 V, the step-down stabilization unit 120 is programmed such that the reverse voltage from 120 V to 360 V or greater is not applied to the diodes 172 and 174. The reverse voltage applied to the diodes 172 and 174 is most preferably from 20% to 60% but may be from 2% to 90% of the reverse withstand voltage of the diodes 172 and 174.

The isolation amplifier 130 converts the current (also referred to as leakage current: IRD) flowing through the diodes 172 and 174 into a voltage by the reverse voltage applied to the diodes 172 and 174 by the step-down stabilization unit 120. A resistor (not shown) that converts the current flowing through the diodes 172 and 174 into a voltage is built in the isolation amplifier 130. A current having a current value obtained by adding a current value of the current of the diode 172 and a current value of the current of the diode 174 flows through this resistor. As a result, a voltage Vb between terminals of the resistor is a voltage value (V) obtained by multiplying a resistance value (R) of the resistor by a current value obtained by adding the current value ($i_{172}$) of the current of the diode 172 and the current value ($i_{174}$) of the current of the diode 174. That is, the voltage between the terminals of the resistor is represented by an equation of $Vb = R \times (i_{172} + i_{174})$.

The isolation amplifier 130 is an amplifier that isolates an input side (power source side) from an output side (control unit side), and outputs the reverse voltage Va applied to the diodes 172 and 174 by the step-down stabilization unit 120 and the voltage Vb between the terminals of the resistor to the inverter control unit 140.

As described above, the isolation amplifier 130 functions as the current detection unit that detects the current value of the current flowing through the diodes 172 and 174 when the step-down stabilization unit 120 applies the reverse voltage to the diodes 172 and 174. The isolation amplifier 130 includes the resistor connected in series to the diodes 172 and 174, and detects the current value of the current flowing through the diodes 172 and 174 using the voltage Vb between the terminals of the resistor, the voltage Vb being generated by the current flowing through the resistor. The isolation amplifier 130 may be a voltmeter that detects the voltage between the terminals of the built-in resistor. Alternatively, the isolation amplifier 130 may be omitted, and the current may be measured directly by an ammeter. At this time, an operator on site may decide the deterioration degree of the diodes 172 and 174 from a numerical value of the voltmeter or the ammeter.

The inverter control unit 140 stores a determination current value for determining the deterioration of the diodes 172 and 174. The determination current value is set in accordance with electrical characteristics of the diodes 172 and 174 immediately before being damaged. For example, multiple resistance values in a reverse direction of the diodes 172 and 174 immediately before being damaged are measured, and the resistance values are accumulated. With reference to the accumulated resistance values, a determination current value is calculated, and the calculated determination current value is stored in the inverter control unit 140. It has been known that the current value of the rectifier elements such as diodes 172 and 174 increases when the reverse voltage is applied as the deterioration progresses. For example, when the diodes 172 and 174 deteriorate, a current value of 1 mA or less may become a current value of greater than 100 mA. In this way, the diodes 172 and 174 having a current value exceeding 100 mA will be damaged within a few days. Since the setting of the determination current value is important in deciding the deterioration degree of the diodes 172 and 174, the determination current value is obtained as follows. Assuming that a current of Iinv flows when the reverse voltage Vinv is applied to the diodes immediately before being damaged, the resistance value Rinv of the diodes immediately before being damaged can be obtained as Rinv=Vinv/Iinv. The determination current value can be obtained by dividing the maximum voltage of the reverse voltage applied by the step-down stabilization unit 120 by the resistance value Rinv of the diodes. The determination current value is set to a value slightly smaller than the value obtained as described above in order to increase reliability of the determination of the deterioration degree of the diodes 172 and 174.

Further, the inverter control unit 140 includes a program that compares the current value of the current flowing through the diodes 172 and 174 with the stored determination current value. When the current value of the current flowing through diodes 172 and 174 is larger than the determination current value, the inverter control unit 140 decides that the diodes 172 and 174 have deteriorated. When the current value of the current flowing through the diodes 172 and 174 is smaller than the determination current value, the inverter control unit 140 determines that the diodes 172 and 174 have not deteriorated.

Figure 2:
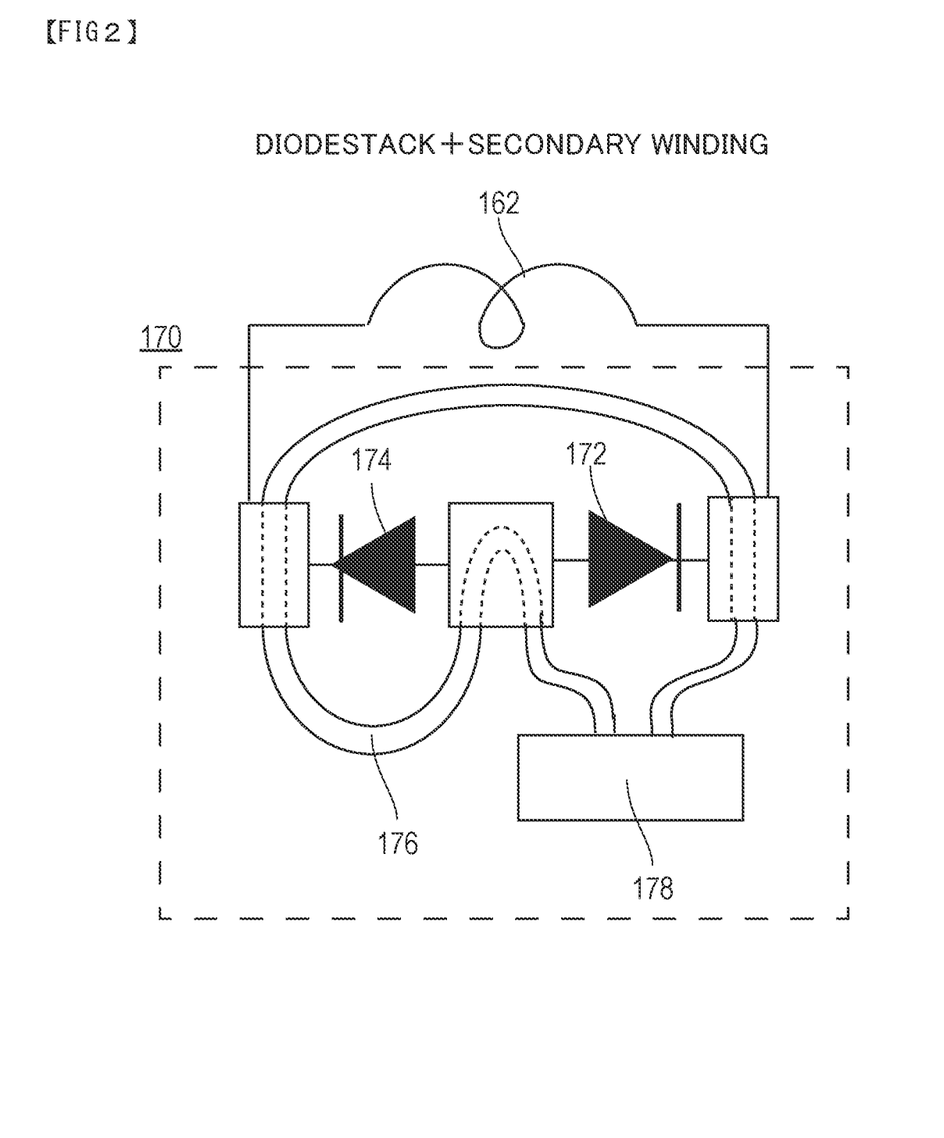
FIG. 2 is a configuration diagram of a diode stack shown in FIG. 1.

FIG. 2 is a configuration diagram of the diode stack shown in FIG. 1. The diode stack 170 is formed of metal bodies having good electric conductivity and heat conductivity, such as copper or the like, and the diodes 172 and 174 are interposed between the metal bodies. The diodes 172 and 174 are connected to the secondary winding 162 of the inverter transformer 160 shown in FIG. 1. The diodes 172 and 174 supply the welding current having a large current value to the electrodes 220 of the welding gun 210, and thus generate heat and become hot. Since the diodes 172 and 174 are damaged at high temperatures, a cooling water passage 176 that circulates cooling water is disposed in the diode stack 170 as shown in the drawing. A temperature of the diode stack 170 and the diodes 172 and 174 is adjusted to a temperature suitable for operation by circulating cooling water through the cooling water passage 176 via a manifold 178.

The manifold 178 is provided with a water supply valve (not shown). When the shifting unit 150 has been shifted to the normal mode, the water supply valve is turned on to circulate the cooling water through the cooling water passage 176. On the other hand, when the shifting unit 150 has been shifted to the measurement mode, the water supply valve is turned off, and air is supplied to remove the cooling water from the cooling water passage 176. Note that the turn-on and turn-off of the water supply valve is controlled by the inverter control unit 140.

<Operation of Inverter Power Supply>

[Normal Mode]

Figure 3:
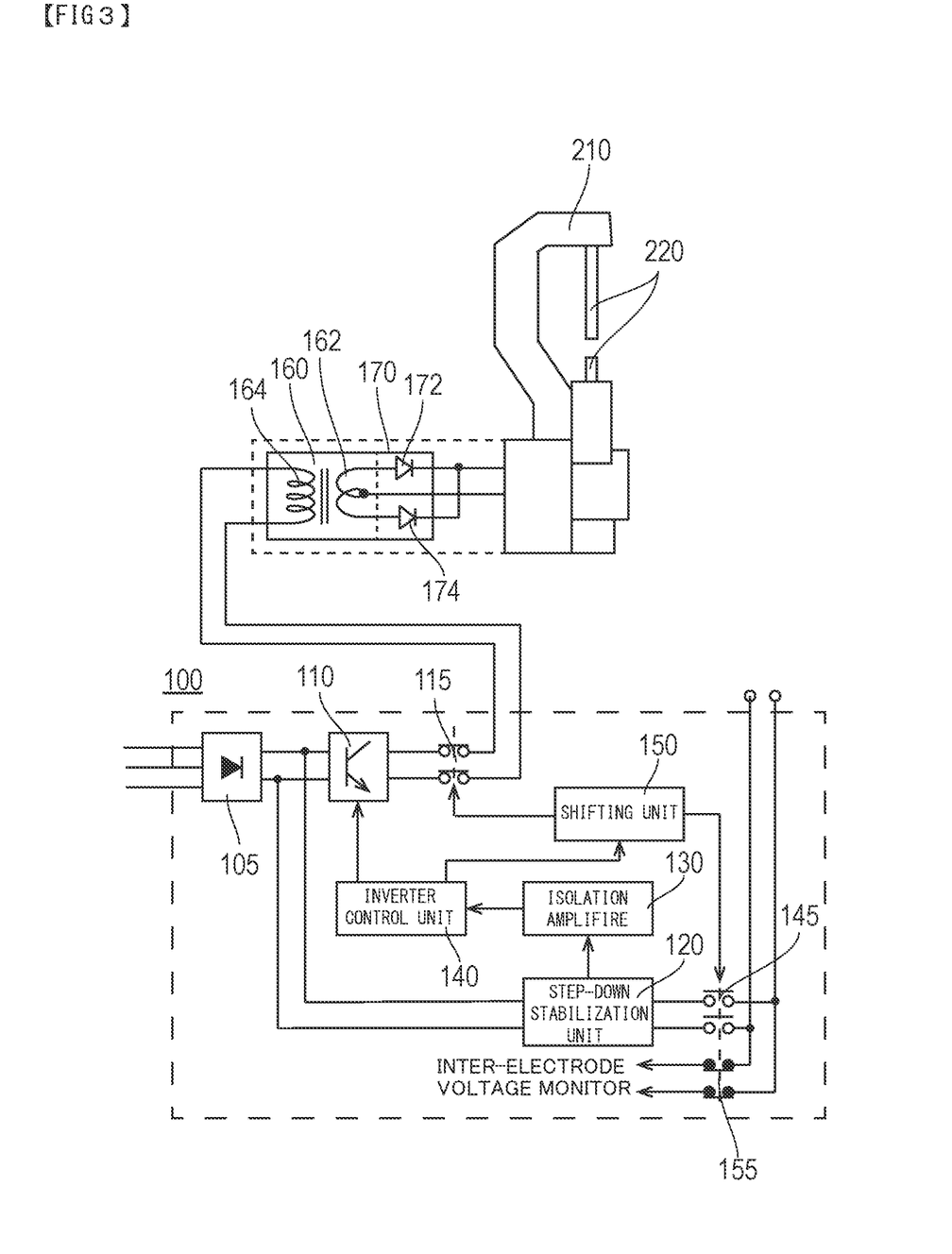
FIG. 3 is an explanatory diagram of the inverter power supply of the embodiment in a normal mode.
Figure 4:
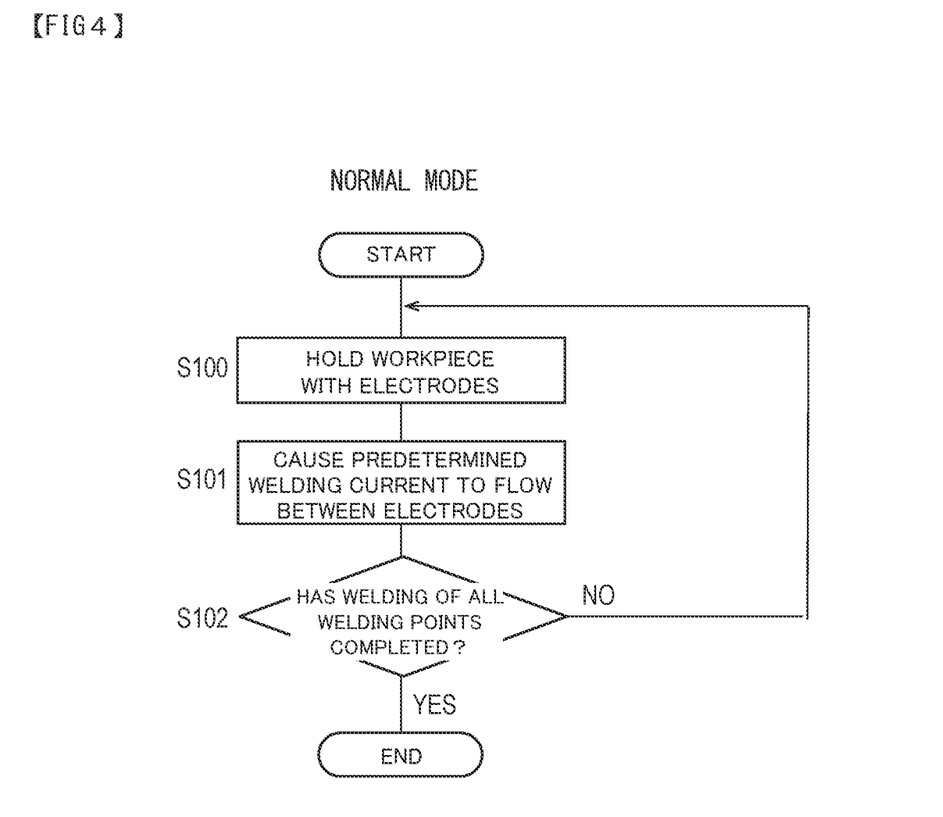
FIG. 4 is an operation flowchart of the inverter power supply of the embodiment in the normal mode.

FIG. 3 is an explanatory diagram of the inverter power supply of the embodiment in the normal mode. FIG. 4 is an operation flowchart of the inverter power supply of the embodiment in the normal mode.

When the shifting unit 150 shifts the mode to the normal mode, the shifting unit 150 turns on the A contact relay 115 and turns off the A contact relay 145. Consequently, the switching unit 110 and the primary winding 164 of the inverter transformer 160 are connected, and the step-down stabilization unit 120 and the isolation amplifier 130 stop functioning.

In the normal mode, first, the welding robot holds a workpiece with the electrodes 220 of the welding gun 210 (S100). Next, the inverter control unit 140 energizes a predetermined welding current between the electrodes 220 (S101). The inverter control unit 140 switches the switching unit 110 to generate a predetermined AC current from the rectification unit 105, and supplies the AC current to the primary winding 164 of the inverter transformer 160. The inverter transformer 160 reduces a primary voltage of the primary winding 164 by the secondary winding 162, and supplies a reduced secondary voltage to the diodes 172 and 174 of the diode stack 170. The diodes 172 and 174 supply the rectified welding current between the electrodes 220 of the welding gun 210 to weld the steel plate as the workpiece. At this time, since the cooling water flows through the cooling water passage 176 in the diode stack 170, the heat generation from the diodes 172 and 174 is suppressed.

The inverter control unit 140 decides whether welding of all predetermined welding points has completed (S102). When the welding of all the welding points is not completed (S102: NO), the processing returns to step S100, and the next point is welded. When the welding of all the welding points has completed (S102: YES), the welding operation is completed.

[Measurement Mode]

Figure 5:
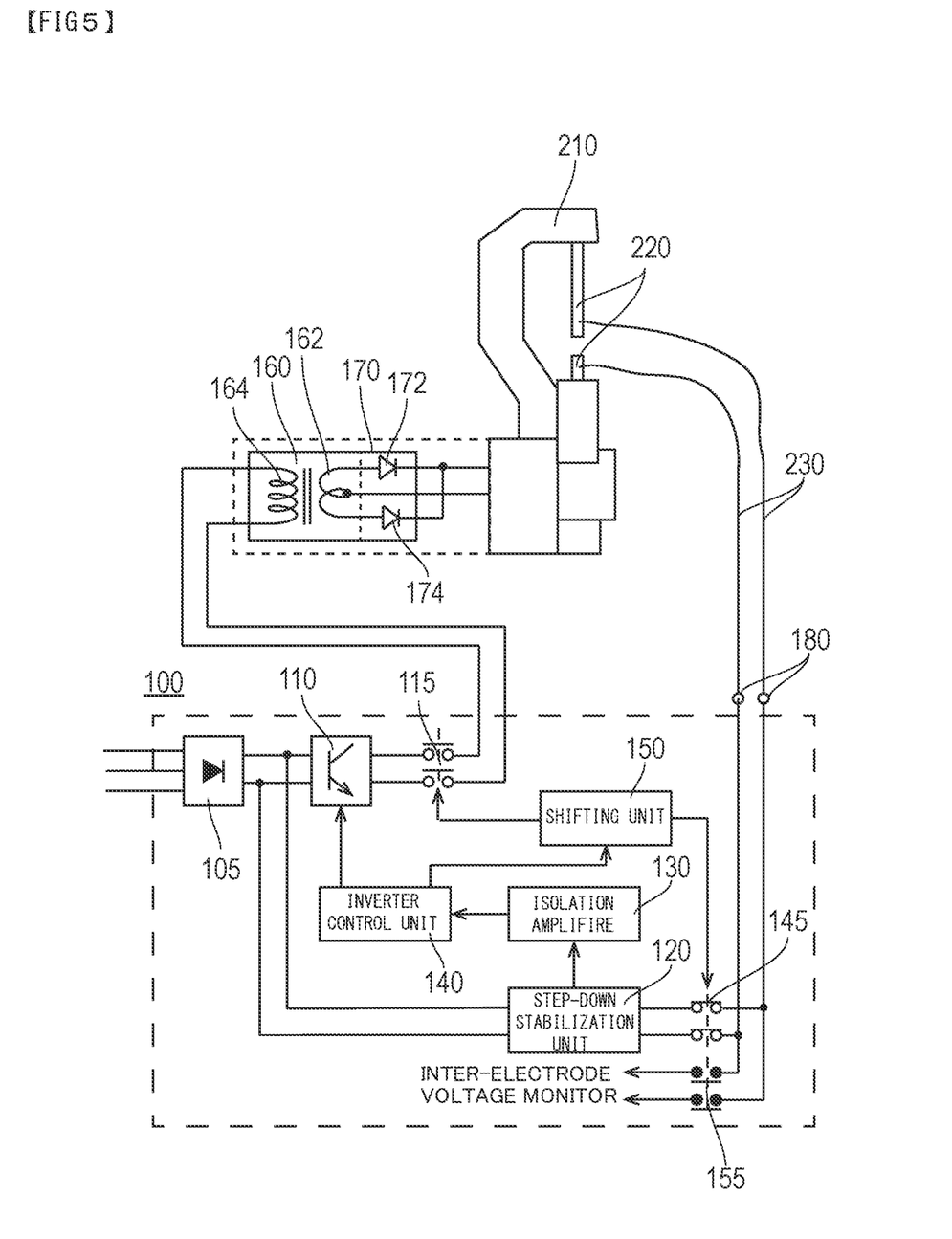
FIG. 5 is an explanatory diagram of the inverter power supply of the embodiment in a measurement mode.
Figure 6:
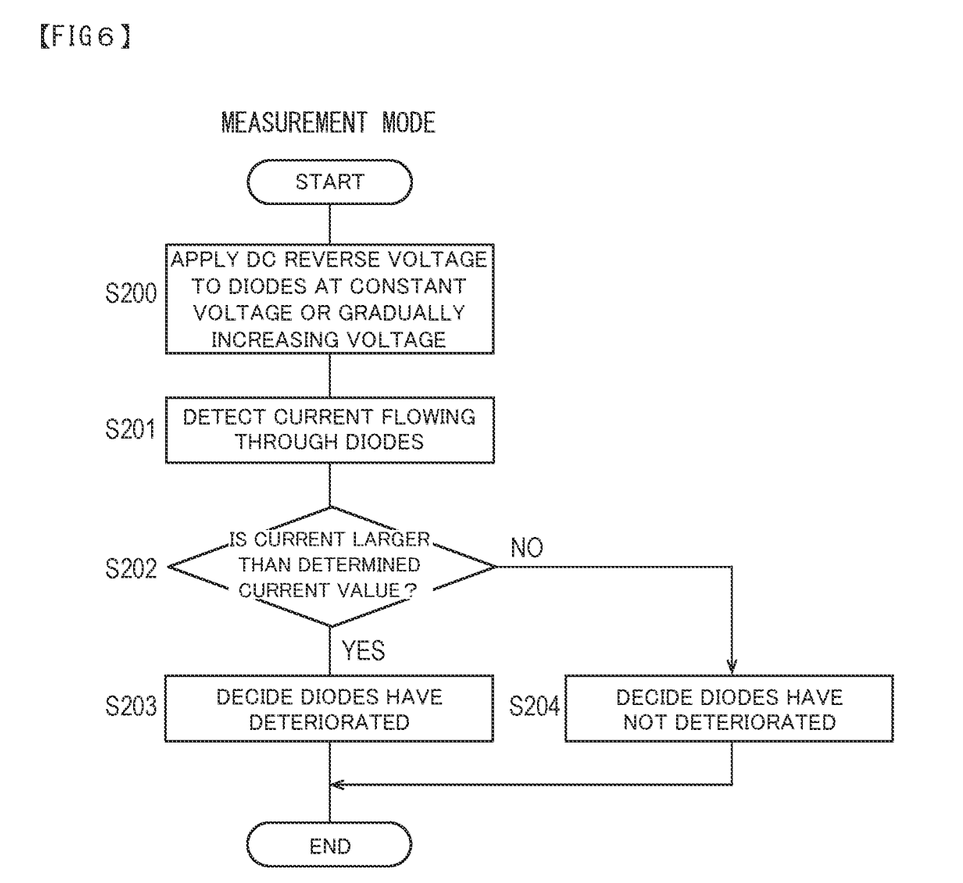
FIG. 6 is an operation flowchart of the inverter power supply of the embodiment in the measurement mode.
Figure 7:
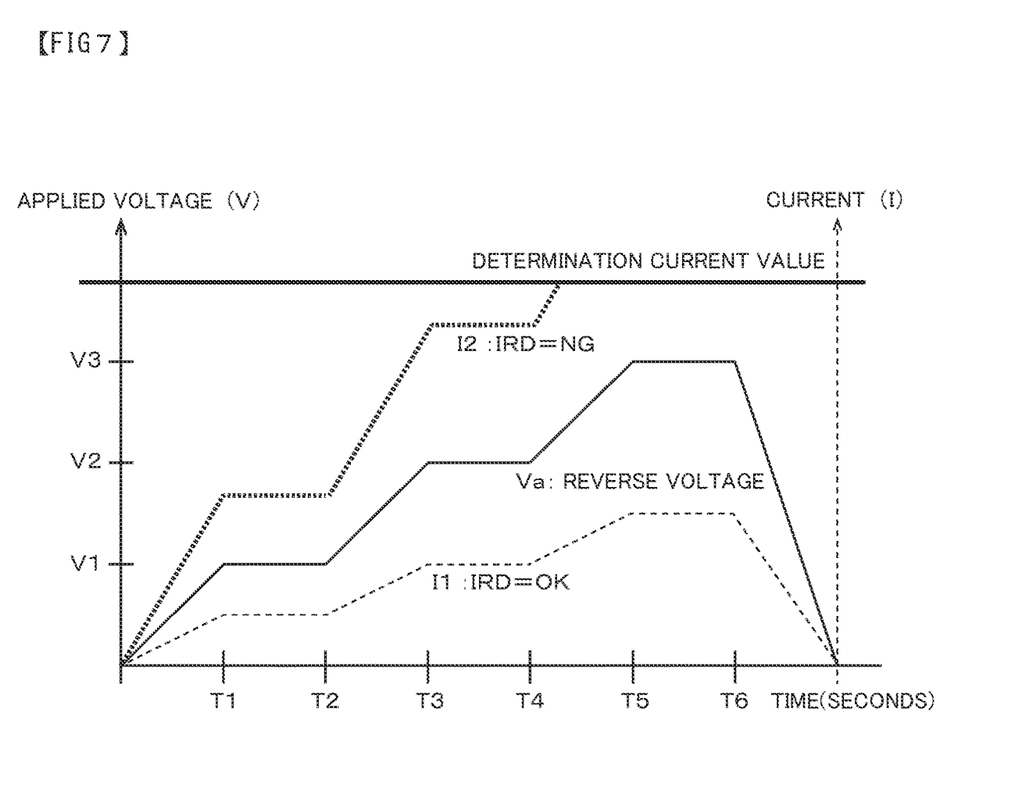
FIG. 7 is a diagram provided for explanation of the operation flowchart in FIG. 6.

FIG. 5 is an explanatory diagram of the inverter power supply of the embodiment in the measurement mode. FIG. 6 is an operation flowchart of the inverter power supply of the embodiment in the measurement mode. FIG. 7 is a diagram provided for explanation of the operation flowchart in FIG. 6.

As shown in FIG. 5, when the shifting unit 150 shifts the mode to the measurement mode, the shifting unit 150 turns off the A contact relay 115 and turns on the A contact relay 145. Consequently, the switching unit 110 and the primary winding 164 of the inverter transformer 160 are disconnected, and the step-down stabilization unit 120 and an output terminal 180 are connected. Further, the inverter control unit 140 stops the cooling water flowing through the cooling water passage 176 of the diode stack 170, and supplies air to remove the cooling water from the cooling water passage 176. This is because, when the cooling water is removed, the deterioration degree of the diodes 172 and 174 of the diode stack 170 can be measured more accurately without being affected by the cooling water. When the mode is shifted to the measurement mode, the output terminal 180 of the inverter power supply 100 and the electrodes 220 are connected by a measurement line 230 such that the voltage of the step-down stabilization unit 120 is applied to the two electrodes 220 of the welding gun 210. As a result, the voltage from the step-down stabilization unit 120 is applied to the diodes 172 and 174 of the diode stack 170 as the reverse voltage. In the measurement mode, the measurement line 230 between the output terminal 180 and the electrodes 220 may be connected by an operator on site. Alternatively, a rod-shaped terminal connected to the output terminal 180 may be interposed between the electrodes 220 by the welding robot such that the deterioration degree of the diodes 172 and 174 can be automatically measured.

First, as shown in the operation flowchart of FIG. 6, the step-down stabilization unit 120 applies the DC reverse voltage to the diodes 172 and 174 at a constant voltage or a stepwise increasing voltage using the DC voltage rectified by the rectification unit 105 (S200).

The step-down stabilization unit 120 stepwise increases the reverse voltage Va applied to the diodes 172 and 174, as shown by the solid line in FIG. 7. For example, the step-down stabilization unit 120 applies V1, then applies V2, and finally applies V3 as the reverse voltage to the diodes 172 and 174. In the embodiment, the voltage is increased in three steps by 50 V. However, the voltage may be increased through a constant voltage, two steps, or four or more steps. The voltage is increased stepwise in this way such that even when the diodes 172 and 174 have significantly deteriorated, the deterioration degree of the diodes 172 and 174 can be measured without damaging the diodes 172 and 174.

Further, when the reverse voltage is increased stepwise, the voltage is increased from the current voltage to the next voltage over the fixed period of time when the voltage is increased to the next step. For example, the step-down stabilization unit 120 applies V1 as the reverse voltage to the diodes 172 and 174 first, and then applies V2 over a period of time from T2 to T3 as shown in FIG. 7, instead of suddenly increasing the voltage from V1 to V2. In the embodiment, the voltage is increased from V1 to V2 linearly, but the voltage may be increased in a curved line instead of linearly. The same applies to the increase in voltage from 0 to V1 and from V2 to V3. Further, a speed of increasing the voltage from V1 to V2 may not be the same as, for example, a speed of increasing the voltage from 0 to V1 or a speed of increasing the voltage from V2 to V3. As described above, the voltage at the current step is increased to the voltage at the next step over the fixed period of time in order to prevent a generation of a high voltage in the primary winding 164 of the inverter transformer 160 due to the change in the current flowing through the secondary winding 162 of the inverter transformer 160. Further, a period of time for maintaining the voltage increased stepwise is the same period of time at each step. For example, when the reverse voltage is increased to V1, the voltage is maintained for the period of time from T1 to T2. When the reverse voltage is increased to V2, the voltage is maintained for a period of time from T3 to T4. When the reverse voltage is increased to V3, the voltage is maintained for a period of time from T4 to T6. The period of time from T1 to T2, the period of time from T3 to T4, and the period of time from T4 to T6 are the same. These periods of time during which the voltage increased stepwise is maintained may be different from step to step. For example, the periods of time for maintaining the voltage may be shorter as the voltage value of the reverse voltage increases.

Further, the maximum voltage of the reverse voltage or V3 is from 20% to 60% of the reverse withstand voltage of the diodes 172 and 174 in order to prevent the diodes 172 and 174 from being damaged when the reverse voltage is applied to the diodes 172 and 174 that have been deteriorating. The voltage lower than the reverse withstand voltage is applied in this way such that even when the diodes 172 and 174 have significantly deteriorated, the deterioration degree of the diodes 172 and 174 can be measured without damaging the diodes 172 and 174. The maximum voltage of the reverse voltage is most preferably from 20% to 60% but may be from 2% to 90% of the reverse withstand voltage of the diodes 172 and 174.

Next, the isolation amplifier 130 detects the current flowing through the diodes 172 and 174 (S201). As described above, the current flowing through the diodes 172 and 174 is detected as the voltage Vb between the terminals of the resistor provided in the isolation amplifier 130. For example, when the diodes 172 and 174 have not been deteriorating (when IRD=OK), the current is detected as indicated by the dotted line I1. On the other hand, when the diodes 172 and 174 have been deteriorating (when IRD=NG), the current is detected as indicated by the dotted line I2.

Next, the inverter control unit 140 decides whether the detected current is larger than the determination current value (S202). When the current flowing through the diodes 172 and 174 is larger than the determination current value (S202: YES) as indicated by the dotted line I2, the inverter control unit 140 decides that the diodes 172 and 174 have deteriorated (S203). On the other hand, when the current flowing through the diodes 172 and 174 is smaller than the determination current value (S202: NO) as indicated by the dotted line I1, the inverter control unit 140 decides that the diodes 172 and 174 have not deteriorated (S204).

In this way, the inverter power supply 100 of the embodiment allows the welding robot to weld in the normal mode, and allows the deterioration degree of the diodes 172 and 174 to be measured using a power source of the inverter power supply 100 in the measurement mode. From the periodic measurement, the deterioration degree of the diodes 172 and 174 can be known, and the diodes 172 and 174 can be preventively maintained and maintained as scheduled. For example, when the inverter power supply 100 of the embodiment is used in a production line in which the welding robot is disposed, a voltage obtained by reducing the voltage (about 600 V DC) of the power source in the inverter power supply 100 can be applied to the diodes 172 and 174. As a result, the diodes 172 and 174 can be preventively maintained, and thus the production line can be prevented from being stopped. This can improve production efficiency and reduce production costs.

In the embodiment, the output terminal 180 of the inverter power supply 100 and the electrodes 220 of the welding gun 210 are connected by the measurement line 230 in the measurement mode. However, when the measurement line 230 linked to the output terminal 180 of the inverter power supply 100 is connected to the electrodes 220 of the welding gun 210 in advance and wired along a robot arm, the measurement operation can be automated or simplified.

As described above, the inverter power supply of the embodiment allows the deterioration degree of the rectifier element such as the diode to be easily measured on site. This can prevent a situation where a production machine such as a welding robot suddenly stops due to the deterioration of the diodes and the production line is forced to stop for a long time for a replacement of the diode stack together with the transformer. Further, since the diodes can be preventively maintained, the diode stack can be replaced as scheduled.

Although the embodiment of the inverter power supply has been described above, the technical scope of the present invention is not limited to the description of the embodiment. What is not explicitly described in the embodiment but modified by those skilled in the art within the scope of the claims is included in the technical scope of the present invention.

REFERENCE SIGNS LIST

100 Inverter power supply
105 Rectification unit
110 Switching unit
115, 145 A contact relay
120 Step-down stabilization unit
130 Isolation amplifier (current detection unit)
140 Inverter control unit (decision unit)
150 shifting unit
155 B contact relay
160 Inverter transformer
162 Secondary winding
164 Primary winding
170 Diode stack
172, 174 Diode
176 Cooling water passage
178 Manifold
180 Output terminal
210 Welding gun
220 Electrode
230 Measurement line

The invention claimed is:

1. An inverter power supply comprising:

a rectifier element that is a diode of a diode stack provided in an inverter transformer included in a resistance welder;

a power source that applies a reverse voltage increasing gradually to the rectifier element;

a current detection unit that detects a current value of a current flowing through the rectifier element when the reverse voltage is applied;

a shifting unit configured to shift between a normal mode in which a welding current is supplied to the resistance welder and a measurement mode in which deterioration of the rectifier element is determined, wherein in the normal mode, the power source and the current detection unit stop functioning, and in the measurement mode, the power source and the current detection unit start functioning; and a controller configured to, in the measurement mode:
determine that the rectifier element has deteriorated when the detected current value is larger than a determination current value for determining the deterioration of the rectifier element; and
determine that the rectifier element has not deteriorated when the detected current value is smaller than the determination current value for determining the deterioration of the rectifier element, wherein the diode stack has a cooling water passage that cools the diode, the shifting unit further configured to circulate cooling water through the cooling water passage in the normal mode, and remove the cooling water from the cooling water passage in the measurement mode.

2. The inverter power supply according to claim 1, wherein the power source stepwise increases the reverse voltage applied to the rectifier element.

3. The inverter power supply according to claim 2, wherein the reverse voltage is increased stepwise from a voltage at a current step to a voltage at a next step over a fixed period of time when the reverse voltage is increased to the next step.

4. The inverter power supply according to claim 1, wherein a maximum voltage of the reverse voltage applied to the rectifier element is from 20% to 60% of a reverse withstand voltage of the rectifier element such that the rectifier element is not damaged when the reverse voltage is applied to the rectifier element that has been deteriorating.

5. The inverter power supply according to claim 1, wherein the current detection unit includes a resistor connected in series to the rectifier element, and detects the current value of the current flowing through the rectifier element, using a voltage between terminals of the resistor generated by a current flowing through the resistor.

6. The inverter power supply according to claim 1, wherein the determination current value for determining the deterioration of the rectifier element is set based on electrical characteristics of the rectifier element before being damaged.

* * * * *